(12) United States Patent
Yang et al.

(10) Patent No.: US 11,209,506 B2
(45) Date of Patent: Dec. 28, 2021

(54) MAGNETIC RESONANCE IMAGING SCAN METHOD AND MAGNETIC RESONANCE IMAGING SYSTEM

(71) Applicant: GE Precision Healthcare LLC, Wauwatosa, WI (US)

(72) Inventors: Fan Yang, Beijing (CN); Yuechen Liu, Beijing (CN); Kun Wang, Beijing (CN)

(73) Assignee: GE Precision Healthcare LLC, Wauwatosa, WI (US)

(*) Notice: Subject to any disclaimer, the term of this patent is extended or adjusted under 35 U.S.C. 154(b) by 0 days.

(21) Appl. No.: 16/988,902

(22) Filed: Aug. 10, 2020

(65) Prior Publication Data

US 2021/0041514 A1    Feb. 11, 2021

(51) Int. Cl.
  *G01R 33/28* (2006.01)
  *G01R 33/54* (2006.01)
  *G01R 33/58* (2006.01)
  *G01R 33/48* (2006.01)

(52) U.S. Cl.
  CPC ....... *G01R 33/288* (2013.01); *G01R 33/4804* (2013.01); *G01R 33/546* (2013.01); *G01R 33/58* (2013.01)

(58) Field of Classification Search
  CPC .... G01R 33/288; G01R 33/546; G01R 33/58; G01R 33/4804; G01R 33/285; A61B 5/055
  USPC ........................................................ 324/309
  See application file for complete search history.

(56) References Cited

U.S. PATENT DOCUMENTS

| | | | |
|---|---|---|---|
| 2012/0086449 A1* | 4/2012 | Graesslin | G01R 33/285 324/309 |
| 2013/0289389 A1* | 10/2013 | Hermann | A61N 5/1015 600/424 |
| 2016/0252592 A1 | 9/2016 | Van Den Brink | |
| 2018/0289318 A1* | 10/2018 | Howard | A61N 5/0622 |

FOREIGN PATENT DOCUMENTS

DE    1020060160431 A    10/2007

* cited by examiner

*Primary Examiner* — Christopher P McAndrew

(57) ABSTRACT

The present application provides a magnetic resonance imaging scan method, a magnetic resonance imaging system, and a non-transitory computer-readable storage medium. The magnetic resonance imaging scan method comprises indicating in real time values of parameters associated with an implant device in a tested object and safety status of one or a plurality of the parameters during performing an imaging scan.

19 Claims, 6 Drawing Sheets

MAGNETIC RESONANCE IMAGING SCAN METHOD AND MAGNETIC RESONANCE IMAGING SYSTEM

TECHNICAL FIELD

The present invention relates to a medical imaging technique, in particular to a magnetic resonance imaging scan method and a magnetic resonance imaging system.

BACKGROUND

Magnetic resonance imaging (MRI), as a medical imaging modality, can obtain images of the human body without using X-rays or other ionizing radiation. MRI uses a magnet having a strong magnetic field to generate a static magnetic field B0. When a to-be-imaged part of the human body is positioned in the static magnetic field B0, nuclear spin associated with hydrogen nuclei in human tissue is polarized, so that the tissue of the to-be-imaged part generates a longitudinal magnetization vector at a macroscopic level. After a radio-frequency field B1 intersecting the direction of the static magnetic field B0 is applied, the direction of rotation of protons changes so that the tissue of the to-be-imaged part generates a transverse magnetization vector at a macroscopic level. After the radio-frequency field B1 is removed, the transverse magnetization vector decays in a spiral manner until it is restored to zero. A free induction decay signal is generated during decay. The free induction decay signal can be acquired as a magnetic resonance signal, and a tissue image of the to-be-imaged part can be reconstructed based on the acquired signal.

Before imaging the human body through a magnetic resonance imaging technique, a safety assessment needs to be made for implant devices in the human body, such as a cardiac pacemaker, an orthopedic implant instrument, and a puncture device, as such devices may pose safety concerns during a magnetic resonance imaging process. To avoid such concerns, some hospitals prescribe that MRI examinations are prohibited for patients having implant devices or certain types of implant devices in their bodies.

In recent years, more and more people choose to have medical, orthopedic, plastic and other devices implanted in their bodies. The number of patients with implant devices is projected to increase by 71% by 2020. Therefore, the restrictions on the implant devices would have the potential to deprive such patients of the opportunity to be properly diagnosed and treated and would be disadvantageous to the popularity of MRI technique.

SUMMARY

The present invention provides a magnetic resonance imaging scan method, a magnetic resonance imaging system, and a non-transitory computer-readable storage medium.

An exemplary embodiment of the present invention provides a magnetic resonance imaging scan method. The method comprises indicating in real time values of parameters associated with an implant device in a tested object and safety status of one or a plurality of the parameters during performing an imaging scan.

Specifically, prior to performing the imaging scan, the method further comprises determining scan parameters for performing the imaging scan based on information of the implant device in the tested object, and the parameters associated with the implant device include one or a plurality of the scan parameters.

Specifically, the information of the implant device is obtained by receiving information input by a user via an input device of a magnetic resonance imaging system, or by accessing to a tested object information memory.

Specifically, determining scan parameters for performing the imaging scan based on the information of the implant device in the tested object comprises obtaining rated scan parameters corresponding to the implant device based on the information of the implant device, so as to obtain the scan parameters for performing the imaging scan. Further, the rated scan parameters are obtained by accessing to a database storing the information of the implant device and the corresponding rated scan parameters.

Specifically, the information of the implant device is obtained based on at least one scan from the group consisting of a pre-scan, a whole-body rough scan, and a calibration scan, and comprises location information of the implant device relative to a scan center of a magnetic resonance imaging system. Further, the determining scan parameters for performing the imaging scan based on the information of the implant device in the tested object comprises determining relatively safe scan parameters smaller than the scan parameters adopted when no implant is present based on the location information of the implant device relative to the scan center of the magnetic resonance imaging system, so as to obtain the scan parameters for performing the imaging scan.

Specifically, the parameters associated with the implant device are displayed in a display unit of a magnetic resonance imaging system.

Specifically, the parameters associated with the implant device include one or more parameters from the group consisting of a gradient magnetic field intensity, a radio frequency magnetic field intensity, a main magnetic field spatial gradient intensity, a temperature, and a specific absorption rate (SAR). Further, the temperature is obtained based on magnetic resonance thermometry.

Specifically, when the values of the parameters exceed preset threshold, a corresponding warning is issued. Further, when the values of the parameters exceed preset thresholds thereof, a warning is issued by changing the safety status of the parameters.

Specifically, the method further comprises adjusting corresponding scan parameters based on the safety status of the parameters associated with the implant device and performing a new imaging scan based on the adjusted scan parameters.

An exemplary embodiment of the present invention further provides a magnetic resonance imaging scan method, which comprises performing at least one scan from the group consisting of a pre-scan, a whole-body rough scan, and a calibration scan on a tested object to obtain a corresponding image; obtaining information of an implant device in the tested object based on the image; setting scan parameters of an imaging scan, the scan parameters being predetermined based on the information of the implant device; and performing the imaging scan, and indicating in real time values of the parameters associated with the implant device in the tested object and safety status of one or a plurality of the parameters, wherein the parameters associated with the implant device include one or a plurality of the scan parameters.

An exemplary embodiment of the present invention further provides a non-transitory computer-readable storage medium for storing computer programs which, when executed by a computer, cause the computer to perform the above-mentioned instructions for the magnetic resonance imaging scan method.

An exemplary embodiment of the present invention further provides a magnetic resonance imaging system, which comprises a display unit for indicating in real time values of the parameters associated with the implant device in the tested object and safety status of one or a plurality of the parameters during performing the imaging scan.

Specifically, the system further comprises a control unit for determining scan parameters for performing the imaging scan based on information of the implant device in the tested object, and the parameters associated with the implant device include one or a plurality of the scan parameters.

Specifically, the magnetic resonance imaging system further comprises an input device and a tested object information memory. The control unit is further used to receive information input by a user via the input device or to access to the tested object information memory to obtain the information of the implant device.

Specifically, the control unit is further used to obtain rated scan parameters corresponding to the implant device based on the information of the implant device so as to obtain the scan parameters for performing the imaging scan.

Specifically, the magnetic resonance imaging system further comprises a scan obtaining unit for obtaining location information of the implant device relative to a scan center of the magnetic resonance imaging system based on at least one scan from the group consisting of a pre-scan, a whole-body rough scan, and a calibration scan. Further, the control unit is further used to determine relatively safe scan parameters smaller than scan parameters adopted when no implant is present based on the location information of the implant device relative to the scan center of the magnetic resonance imaging system obtained by the scan obtaining unit, so as to obtain the scan parameters for performing the imaging scan.

Specifically, the parameters associated with the implant device include one or more parameters from the group consisting of a gradient magnetic field intensity, a radio frequency magnetic field intensity, a main magnetic field spatial gradient intensity, a temperature, and a specific absorption rate (SAR).

Specifically, the magnetic resonance imaging system further comprises an infrared camera installed in a scan cavity of the magnetic resonance imaging system to obtain a temperature of the tested object.

Specifically, the display unit is further used to issue a corresponding warning when the values of the parameters exceed preset thresholds. Further, the display unit is further used to issue a warning by changing the safety status of the parameters when the values of the parameters exceed preset thresholds.

Other features and aspects will become clear through the following detailed description, accompanying drawings and claims.

BRIEF DESCRIPTION OF THE DRAWINGS

The present invention may be better understood by describing exemplary embodiments of the present invention with reference to accompanying drawings, in which.

DETAILED DESCRIPTION OF THE EMBODIMENTS

Figure 1:
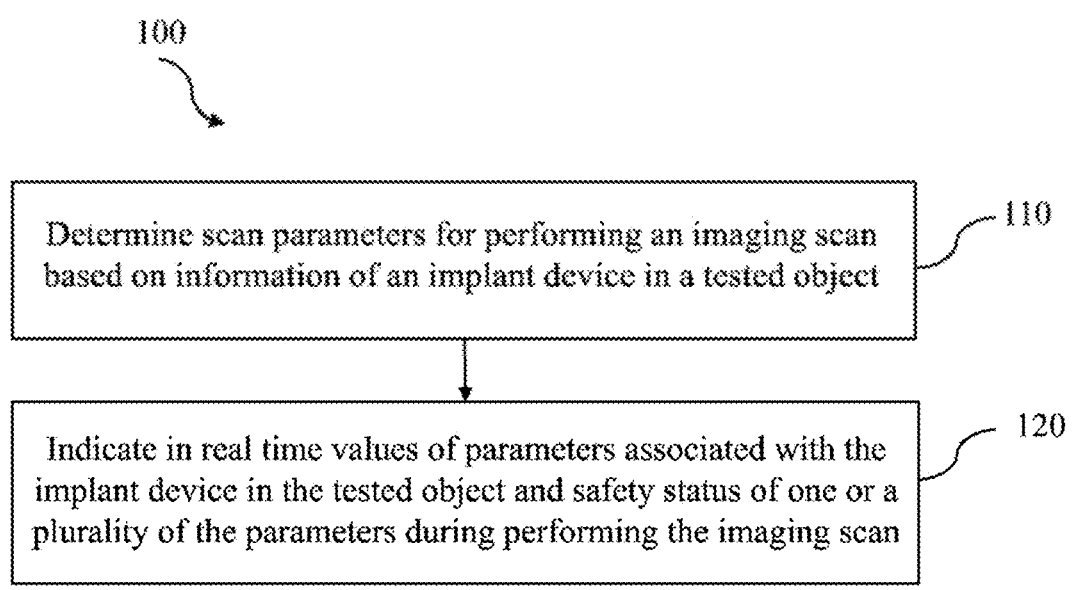
FIG. 1 is a flowchart of a magnetic resonance imaging scan method according to some embodiments of the present invention.

Specific implementation manners of the present invention will be described in the following. It should be noted that during the specific description of the implementation manners, it is impossible to describe all features of the actual implementation manners in detail in this description for the sake of brief description. It should be understood that in the actual implementation of any of the implementation manners, as in the process of any engineering project or design project, a variety of specific decisions are often made in order to achieve the developer's specific objectives and meet system-related or business-related restrictions, which will vary from one implementation manner to another. Moreover, it can also be understood that although the efforts made in such development process may be complex and lengthy, for those of ordinary skill in the art related to content disclosed in the present invention, some changes in design, manufacturing, production or the like based on the technical content disclosed in the present disclosure are only conventional technical means, and should not be construed as that the content of the present disclosure is insufficient.

Unless otherwise defined, the technical or scientific terms used in the claims and the description are as they are usually understood by those of ordinary skill in the art to which the present invention pertains. The words "first," "second" and similar words used in the description and claims of the patent application of the present invention do not denote any order, quantity or importance, but are merely intended to distinguish between different constituents. "One," "a(n)" and similar words are not meant to be limiting, but rather denote the presence of at least one. The word "include," "comprise" or a similar word is intended to mean that an element or article that appears before "include" or "comprise" encompasses an element or article and equivalent elements that are listed after "include" or "comprise," and does not exclude other elements or articles. The word "connect," "connected" or a similar word is not limited to a physical or mechanical connection, and is not limited to a direct or indirect connection.

In some embodiments, the presence of an implant device such as a cardiac pacemaker, an orthopedic implant instrument, and a puncture device in the human body may pose a safety concern during a magnetic resonance imaging scan. A patient may be deprived of the opportunity to be properly diagnosed and treated if a magnetic resonance imaging scan examination cannot be performed due to the existence of the implant device. According to the magnetic resonance imaging scan method in some embodiments of the present invention, (relatively) safe scan parameters may be set based on information (e.g., model, manufacturer, and location) of the implant device, and parameters associated with the implant device, such as one or more parameters from the group consisting of a gradient magnetic field intensity, a radio frequency magnetic field intensity, a main magnetic field spatial gradient intensity, a temperature, and a specific absorption rate (SAR), may be indicated in real time (in the display unit of the magnetic resonance imaging system). Based on the parameters that are indicated in real time, the scan parameters can be adjusted in real time. For example, when the gradient field intensity exceeds its preset threshold, the gradient field intensity can be reduced or decreased during subsequent scan. According to the magnetic resonance imaging scan method in some embodiments of the present invention, a relatively safe magnetic resonance imaging scan may be performed on the tested object with an implant device.

FIG. 1 shows a flowchart of the magnetic resonance imaging scan method 100 according to some embodiments of the present invention. As shown in FIG. 1, the magnetic resonance imaging scan method 100 in some embodiments of the present invention comprises step 120.

In step 120, during performing the imaging scan, the values of parameters associated with the implant device in the tested object and the safety status of one or a plurality of the parameters are indicated in real time. Details will be further described with reference to FIG. 3.

In some embodiments, the magnetic resonance imaging scan method 100 further comprises step 110 prior to performing the imaging scan.

In step 110, scan parameters for performing the imaging scan are determined based on information of the implant device in the tested object. The parameters associated with the implant device include one or a plurality of the scan parameters.

Figure 2:
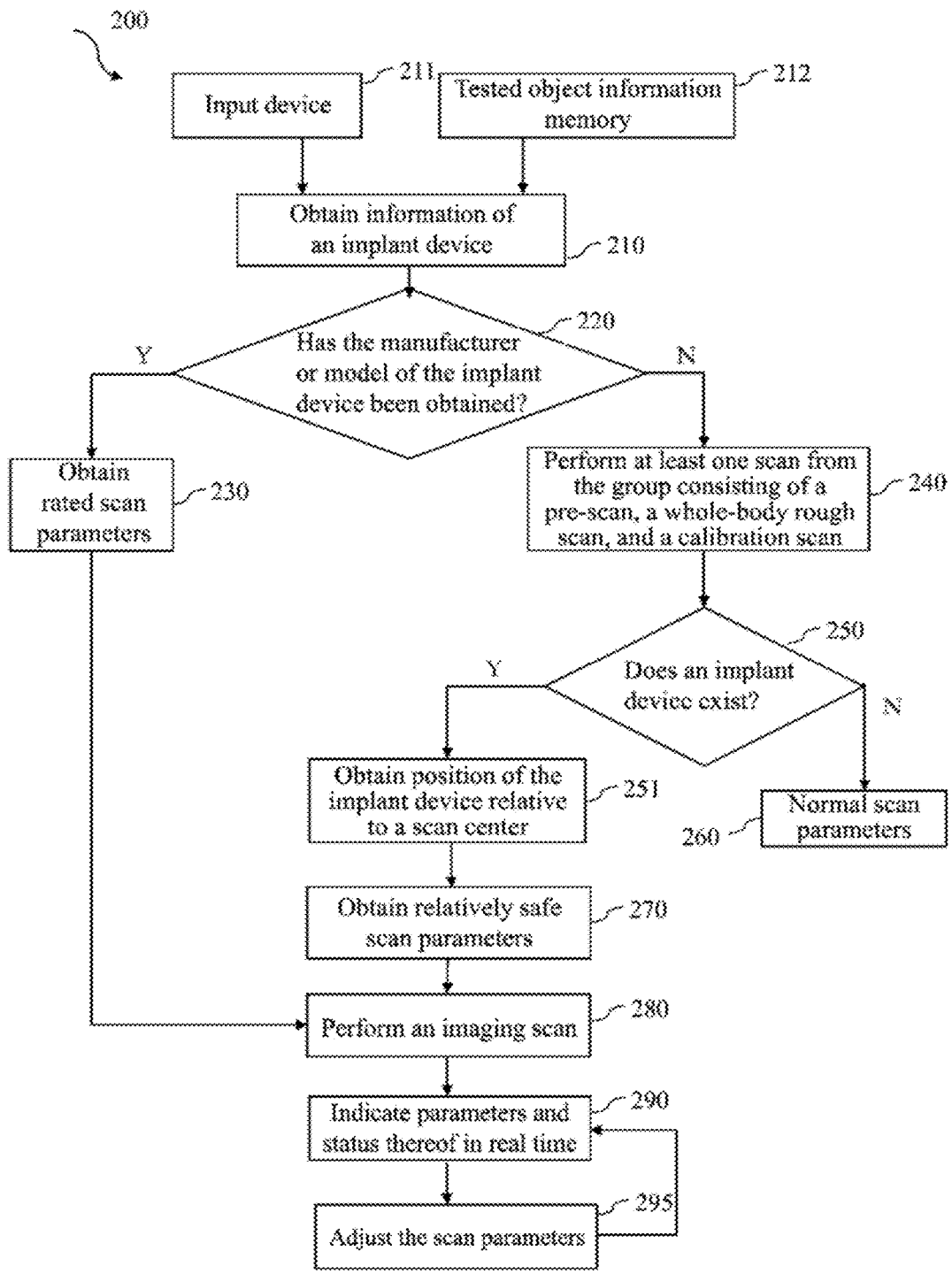
FIG. 2 is a detailed flowchart of the scan method shown in FIG. 1.

FIG. 2 shows a detailed schematic diagram of the scan method shown in FIG. 1. As shown in FIG. 2, obtaining the information of the implant device 210 is realized by receiving the information input by a user via an input device 211 of the magnetic resonance imaging system, or by accessing to a tested object information memory 212.

In some embodiments, the information of the implant device can be obtained by inquiring the case record of the tested object, for example, basic information and/or case information and the like of the tested object can be read through a reader, such as a card reader and a bar code reader. Alternatively, the case information of the tested object can be obtained from the tested object information memory 212 by obtaining basic information (for example, identification number and name) of the tested object through a reader, an inquiry, a checklist or the like. In other embodiments, the information of the implant device can be obtained by obtaining the case information of the tested object through an oral inquiry, a paper-based medical record or the like, so as to be input into the system through the input device. The case information can include the implantation time, implantation mode (e.g., the operation type) and type of the implant device. The type of the implant device may involve information of one or more of the model, manufacturer, size, location, material and the like of the implant device. In some embodiments, the tested object information memory 212 may be integrated in a storage device (or a storage unit) of the magnetic resonance imaging system or may be configured in a cloud storage form.

After obtaining the information of the implant device in step 210, whether the type information (e.g., the manufacturer or model) of the implant device is obtained or not is determined in step 220. For example, if the manufacturer, model or the like of the implant device is obtained, proceed to step 230. Based on the information of the implant device of the tested object, the rated scan parameters corresponding to the implant device are obtained, so as to set the scan parameters for performing the imaging scan based on the rated scan parameters. For example, the rated scan parameters are directly set as the scan parameters for performing the imaging scan. Alternately, if a rated scan parameter has a plurality of selectable parameter values, one of the plurality of selectable parameter values may be selected as the scan parameter for performing the imaging scan according to certain rules. In some embodiments, the corresponding rated scan parameters of the implant device during the magnetic resonance imaging scan are available from the website of the implant device. In other embodiments, the rated scan parameters are obtained by accessing to a database storing the information of the implant device and corresponding rated scan parameters. The database comprises the manufacturer or model of the implant device and rated scan parameters during the corresponding magnetic resonance imaging scan. Specifically, the database may be integrated in the storage device (or the memory) of the magnetic resonance imaging system or may be configured in a cloud storage form. In other embodiments, due to the large quantity and diversity in the manufacturers or models of implant devices, the rated scan parameters cannot be obtained according to the manufacturer, model or other information of the implant device. However, relatively safe scan parameters can still be determined by scanning according to step 240. When the rated scan parameters 230 are obtained, the imaging scan is performed 280 using the rated scan parameters 230.

Although it is described above that the rated scan parameters are obtained according to the implant device and its manufacturer and model in the above-described embodiments, it will be appreciated by those skilled in the art that the rated scan parameters may be obtained from other information of the implant device, specifically the type of the implant device. For example, for an implanted denture, regardless of its model or manufacturer, there may be a fixed set of corresponding rated scan parameters. Furthermore, although the rated scan parameters can be obtained (230) when the manufacturer or model of the implant device is determined as shown in FIG. 2, it will be appreciated by those skilled in the art that the rated scan parameters of implant devices of some manufacturers or models are not available, and in this case, relatively safe scan parameters need to be determined in accordance with steps 240-280.

Although the information of the implant device is obtained 210 and the rated scan parameters are obtained based on the information (e.g., the manufacturer or model) of the implant device as shown in FIG. 2, it will be appreciated by those skilled in the art that the tested object with the implant device may carry with him the rated parameters for the implant device during the magnetic resonance imaging scan. For example, the rated scan parameters may be directly obtained via a card or a case record, and in this case, the manufacturer or model of the implant device is not required.

If the information such as the manufacturer or model of the implant device is not obtained in step 220, proceed to step 240 to perform at least one scan from the group consisting of a pre-scan, a whole-body rough scan, and a calibration scan. Specifically, the pre-scan refers to a scan performed before the magnetic resonance imaging scan, usually for adjusting the operation parameters of hardware to achieve the best scan effect; the calibration scan refers to a scan process performed before the magnetic resonance imaging scan to obtain a part of information to correct or optimize a subsequent formal imaging scan; and the whole-body rough scan refers to a scan process performed before the magnetic resonance imaging scan that adopts relatively (or absolutely) safe scan parameters and aims to determine whether an implant exists or not. Further, the relatively (or absolutely) safe scan parameters may refer to relatively low (or the lowest) gradient magnetic field intensity, radio frequency magnetic field intensity, and main magnetic field spatial gradient intensity.

In some embodiments, a pre-scan is typically performed prior to a magnetic resonance imaging. Therefore, if the pre-scan can determine whether an implant device exists or not and/or determine the location information of the implant device relative to the scan center, the whole-body rough scan and the calibration scan are not required. However, if the pre-scan cannot determine whether an implant device exists or not and/or cannot determine the location information of the implant device relative to the scan center, one or both of the whole-body rough scan and the calibration scan can be performed for the determination. Although at least one of the three scan means is employed to determine in the above-described embodiments, it will be appreciated by those skilled in the art that the means for determining whether an implant device exists or not and/or determining the location information of the implant device relative to the scan center are not limited to the three scan means described above. Furthermore, although the step of obtaining the information of the implant device through the input device or the tested object information memory is arranged before performing at least one scan from the group consisting of the pre-scan, the whole-body rough scan, and the calibration scan, it will be appreciated by those skilled in the art that this step is not necessary, and the information of the implant device may be obtained directly through the scan.

After step 240, whether the implant exists or not 250 is determined. Generally, whether a metal exists or not can be determined based on the sensitivity of the scan parameters to the metal. For example, two sets of images can be obtained by varying the imaging parameters (e.g., time of echo (TE)), and a difference image can be calculated to determine whether an implant device exists or not. It will be appreciated by those skilled in the art that the means for determining whether an implant device exists or not are not limited to the above-mentioned means, and any other suitable means can be employed to determine.

If it is determined, by at least one scan from the group consisting of the pre-scan, the whole body rough scan and the calibration scan, that no implant exists in the tested object, the imaging scan is performed using normal scan parameters 260. If it is determined that the implant device exists, the information of the implant device is obtained by at least one scan from the group consisting of the pre-scan, the whole-body rough scan, and the calibration scan. Specifically, the information of the implant device includes the location information of the implant device relative to the scan center of the magnetic resonance imaging system (step 251).

After step 251, relatively safe scan parameters are determined (or obtained) based on the location information of the implant device relative to the scan center of the magnetic resonance imaging system. Specifically, during a normal scan (in absence of an implant device), the scan parameter corresponding to each point relative to the scan center position is determined. The relatively safe scan parameters are relatively safe scan parameters smaller than the scan parameters adopted when no implant is present. When the relatively safe scan parameters are obtained 270, the imaging scan is performed 280 using the relatively safe scan parameters 270. For example, the radio frequency magnetic field intensity is set to 10 µT in a normal scan in the absence of an implant device. When the rated scan parameters corresponding to the implant device cannot be determined, a relatively safe radio frequency magnetic field intensity, e.g., 7 µT, can be obtained first, and the imaging scan is performed using the relatively safe scan parameter. Similarly, if a rated scan parameter corresponding to the implant device is determined (e.g., the rated radio frequency magnetic field intensity is 8 µT) from the website according to the manufacturer or model of the implant device, the imaging scan can be performed using the rated scan parameter.

In some embodiments, after performing the imaging scan 280, values of parameters and safety status 290 of one or a plurality of the parameters are indicated in real time. Specifically, parameters associated with the implant device are displayed in a display unit of the magnetic resonance imaging system (e.g., the display unit 360 in the magnetic resonance imaging system 300 shown in FIG. 5).

Figure 3:
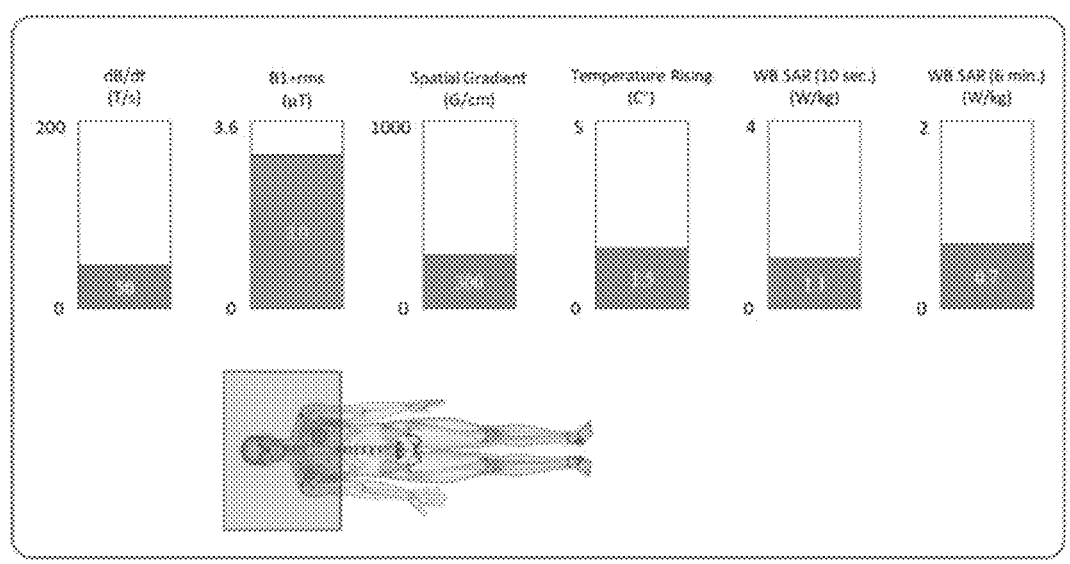
FIG. 3 is a schematic diagram of a user interface for indicating parameters in real time according to some embodiments.

FIG. 3 shows a schematic diagram of a user interface indicating parameters in real time according to some embodiments. As shown in FIG. 3, parameters associated with the implant device include one or more parameters from the group consisting of a gradient magnetic field intensity (dB/dt), a radio frequency magnetic field intensity ($B_1+$), a main magnetic field spatial gradient intensity ($B_0+$), a temperature (T) and a specific absorption rate (SAR), wherein the SAR, with the unit of W/kg, refers to the power or energy absorbed per unit of human body. SAR is a safety-related parameter commonly used in the magnetic resonance imaging process.

It will be appreciated by those skilled in the art that the parameters associated with the implant device are not limited to the one or a plurality of the parameters described above, and may include any magnetic resonance-related parameter.

In some embodiments, the temperature is obtained based on magnetic resonance thermometry (MR thermometry). The magnetic resonance thermometry refers to a non-invasive temperature measurement in which the temperature of an internal tissue (e.g., a tissue in the vicinity of an implant device) of a tested object can be obtained by magnetic resonance imaging. In other embodiments, the temperature may also be obtained based on an infrared camera (the component 390 shown in FIG. 5) installed in a scan cavity of the magnetic resonance imaging system. It will be appreciated by those skilled in the art that the temperature may be obtained by any other component or device that may be used in the magnetic resonance imaging system for temperature measurement, and is not limited to the infrared camera. In addition to measuring temperature, the infrared camera can be provided with other functions, such as monitoring the posture or movement of a patient.

Specifically, for the safety status of one or a plurality of the parameters, different means (e.g., color, text, graphics, or sound) may be adopted to indicate different safety statuses (e.g., safe, relatively dangerous, and dangerous).

In some embodiments, when values of the parameters exceed preset thresholds thereof, a corresponding warning is issued. Further, when the values of the parameters exceed preset thresholds thereof, a warning is issued by changing the safety status of the parameters. An example includes, but not limited to, changing the safety status of the radio frequency magnetic field intensity from blue to orange to issue a warning when the value of the radio frequency magnetic field intensity of one of the parameters exceeds a preset threshold. It will be appreciated by those skilled in the art that change in the safety status of the parameters is not limited to the manner described above.

Figure 4:
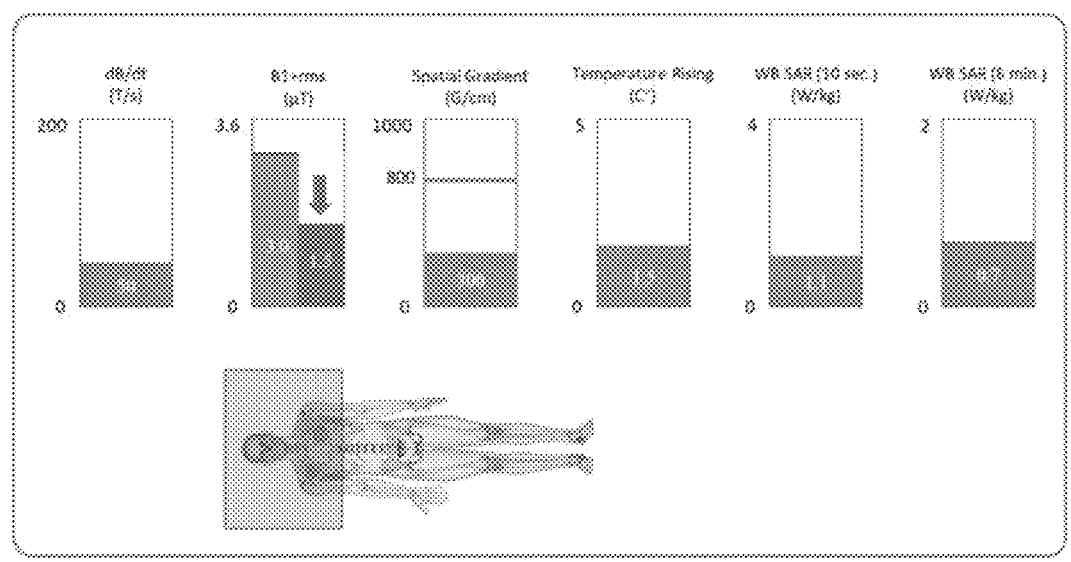
FIG. 4 is a schematic diagram of a user interface for indicating parameters in real time according to other embodiments.

FIG. 4 shows a schematic diagram of a user interface indicating parameters in real time according to other embodiments. In contrast to the user interface shown in FIG. 3, the user interface shown in FIG. 4 may also display a threshold corresponding to each parameter. For example, for the main magnetic field spatial gradient intensity, a preset threshold of 800 is displayed by a red line. Although FIG. 4 shows a threshold for the main magnetic field spatial gradient intensity, it will be appreciated by those skilled in the art that a preset threshold of each parameter can be displayed. In addition, a preset threshold can be displayed by not only the manners shown in the figures, but also any suitable manners. In contrast to the user interface shown in FIG. 3, the user interface shown in FIG. 4 can also simultaneously display a current parameter value (and safety status thereof) and a parameter value before adjustment (and safety status thereof). For example, if the value of a parameter for a radio frequency magnetic field exceeds a preset threshold, it is necessary to form a new scan parameter by changing the intensity value of the radio frequency magnetic field, and when the imaging scan is continued using the new scan parameter, the change process of the value of the parameter can be displayed in real time on a real-time parameter interface, or a current parameter value (e.g., the gradient field intensity of 1.5 on the right side) and the parameter value before change (e.g., the gradient field intensity of 3.0 on the left side) are simultaneously displayed.

Although FIG. 3 and FIG. 4 both show a user interface indicating parameters in real time, it will be appreciated by those skilled in the art that the user interface may involve, not limited to the display mode of histogram described above, any form that can display the status of a real-time parameter. For example, each parameter can be represented in the form of a pointer. In addition, although the figures show that a warning is issued by changing the color when a certain parameter exceeds a preset threshold thereof, the warning may be issued by, not limited to the manner, making a sound, or by the combination of changing the status and making a sound. Moreover, the user interface is not limited to displaying only the contents in FIG. 3 and FIG. 4, but may also include any other relevant information or functions.

With continued reference to FIG. 2, the magnetic resonance imaging scan method in some embodiments of the present invention further comprises adjusting corresponding scan parameters 295 based on parameters associated with the implant device, performing a new imaging scan based on the adjusted scan parameters, indicating the parameters 290 in real time, and repeating the process until the scan (and imaging) process is completed. In some embodiments, a user may manually adjust scan parameters based on parameters (e.g., warning or status change) associated with the implant device to form a new scanning sequence. Optionally, the magnetic resonance imaging system (or a control unit of the magnetic resonance imaging system) is set to automatically adjust scan parameters based on parameters (e.g., warning or status change) associated with the implant device.

As shown in FIG. 2, the magnetic resonance imaging scan method in other embodiments of the present invention comprises performing at least one scan from the group consisting of a pre-scan, a whole-body rough scan, and a calibration scan on a tested object to obtain a corresponding image (step 240); obtaining information of an implant device in the tested object based on the image (step 251); setting scan parameters of an imaging scan, wherein the scan parameters are predetermined based on the information of the implant device (step 270); and performing the imaging scan, and indicating in real time values of parameters associated with the implant device in the tested object and safety status of one or a plurality of the parameters, wherein the parameters associated with the implant device include one or a plurality of the scan parameters (steps 280 and 290).

Using the magnetic resonance imaging scan method disclosed herein, rated scan parameters corresponding to an implant device can be determined (or obtained or searched) based on the model or manufacturer of the implant device; relatively safe scan parameters adopted when no implant device is present can be determined based on location information of the implant device relative to a scan center of the magnetic resonance imaging system, and values and safety status of the parameters are indicated in real time; and when the value of one or a plurality of the parameters exceeds a threshold, a warning can be issued, and a user (or the system) can change the scan parameters based on instructions until the end of the scan. Through the scan mode described above, a tested object with the implant device can be scanned in a relative or absolute scanning mode, so that the discomfort of the tested object is mitigated (or reduced), and the safety of magnetic resonance scan is improved.

Figure 5:
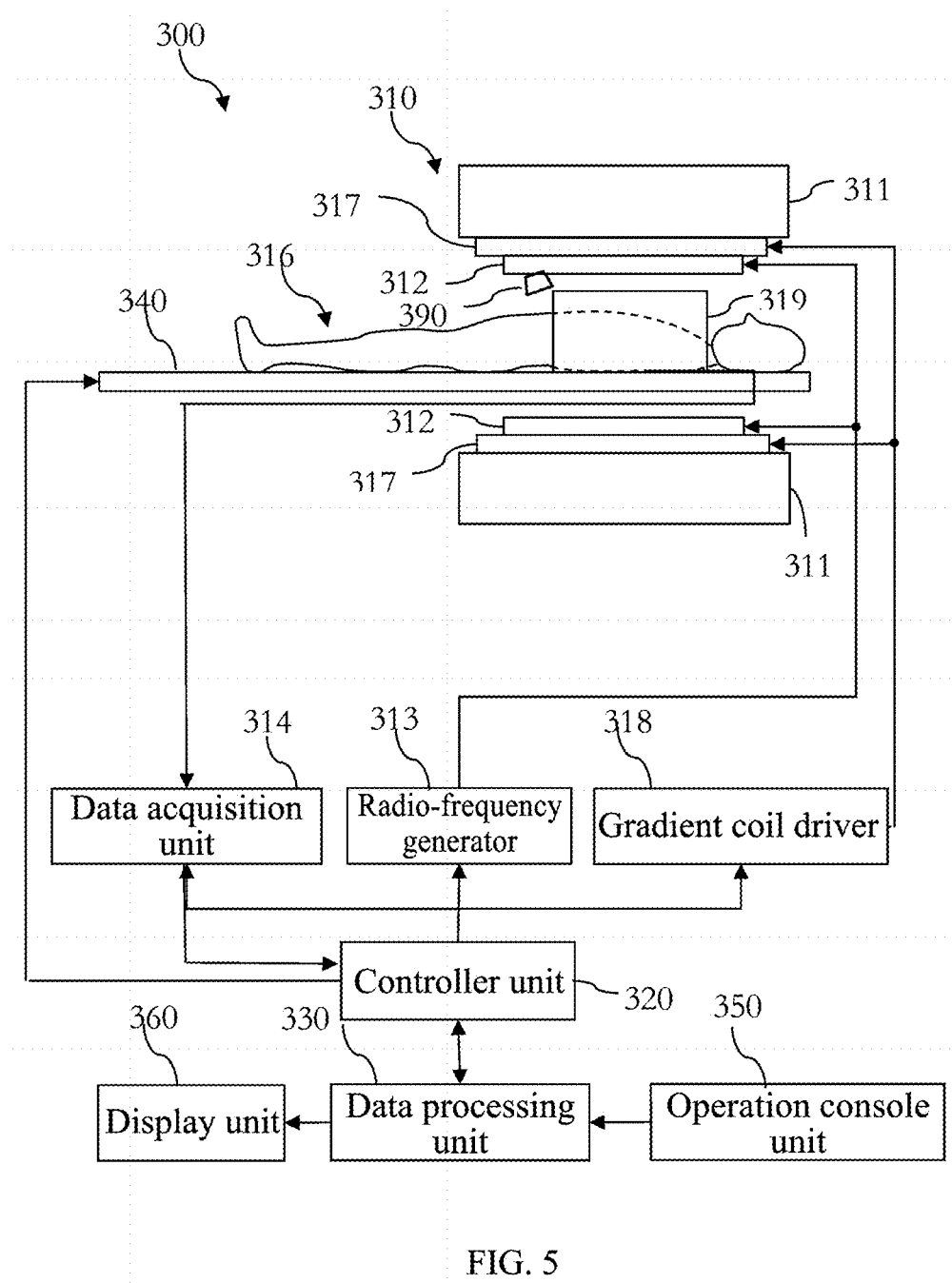
FIG. 5 is a schematic diagram of a magnetic resonance imaging system.

FIG. 5 shows a schematic diagram of a magnetic resonance imaging (MRI) system 300. As shown in FIG. 5, the MRI system 300 comprises a scanner 310, a controller unit 320, and a data processing unit 330. The MRI system 300 is described only as an example. In other embodiments, the MRI system 300 may have a plurality of transformations, as long as image data can be acquired from a tested object.

The scanner 310 may be used to obtain data of a tested object 316. The controller unit 320 is coupled to the scanner 310 to control operation of the scanner 310. The scanner 310 may comprise a main magnet 311, a radio frequency transmit coil 312, a radio frequency generator 313, a gradient coil system 317, a gradient coil driver 318, and a radio frequency receive coil 319.

The main magnet 311 generally comprises, for example, an annular superconducting magnet. The annular superconducting magnet is installed in an annular vacuum container. The annular superconducting magnet defines a cylindrical space surrounding the tested object 316. Moreover, a constant static magnetic field, such as a static magnetic field B0, is generated along a Z direction of the cylindrical space. The MRI system 300 utilizes a generated static magnetic field B0 to emit a magnetostatic pulse signal to the tested object 316 placed in an imaging space, such that the precession of protons in the tested object 316 is ordered and a longitudinal magnetization vector is generated.

The radio frequency generator 313 is used to generate a radio frequency pulse. The radio frequency pulse may comprise a radio frequency excitation pulse. The radio frequency excitation pulse is amplified (by, for example, a radio frequency power amplifier (not shown)), and is then applied to the radio frequency transmit coil 312, so that the radio frequency transmit coil 312 emits to the tested object 316 a radio frequency magnetic field B1 orthogonal to the static magnetic field B0 to excite nuclei in the tested object 316, and the longitudinal magnetization vector is converted into a transverse magnetization vector. After the end of the radio frequency excitation pulse, a free induction decay signal, i.e., a magnetic resonance signal that can be acquired, is generated in the process where the transverse magnetization vector of the tested object 316 is gradually restored to zero.

The radio frequency transmit coil 312 may be a volume coil, wherein the volume coil may be connected to a transmit/receive (T/R) switch (not shown). Through control of the transmit/receive switch, the volume coil can be switched between a transmit mode and a receive mode. In the receive mode, the volume coil may be used to receive a magnetic resonance signal from the tested object 316.

The gradient coil system 317 forms a gradient magnetic field in the imaging space so as to provide three-dimensional position information for the magnetic resonance signal described above. The magnetic resonance signal may be received by the radio frequency receive coil 319, or by the volume coil under the receive mode. The data processing unit 330 may process the received magnetic resonance signal so as to obtain required images or image data.

Specifically, the gradient coil system 317 may comprise three gradient coils. Each of the three gradient coils generates a gradient magnetic field inclined to one of three spatial axes (for example, X-axis, Y-axis, and Z-axis) perpendicular to each other, and generates a gradient field according to imaging conditions in each of a slice selection direction, a phase encoding direction, and a frequency encoding direction. More specifically, the gradient coil system 317 applies a gradient field in the slice selection direction of the tested object 316 so as to select a slice. The radio frequency transmit coil 312 emits a radio frequency excitation pulse to the slice selected for the tested object 316 and excites the slice. The gradient coil system 317 also applies a gradient field in the phase encoding direction of the tested object 316 so as to perform phase encoding on a magnetic resonance signal of the excited slice. The gradient coil system 317 then applies a gradient field in the frequency encoding direction of the tested object 316 so as to perform frequency encoding on the magnetic resonance signal of the excited slice.

The gradient coil driver 318 is used to separately provide a suitable power signal for the aforementioned three gradient coils in response to a sequence control signal transmitted by the controller unit 320.

The scanner 310 may further comprise a data acquisition unit 314. The data acquisition unit is used to acquire a magnetic resonance signal received by a radio frequency surface coil 319 or the volume coil. The data acquisition unit 314 may comprise, for example, a radio frequency preamplifier (not shown), a phase detector (not shown), and an analog-to-digital converter (not shown), wherein the radio frequency preamplifier is used to amplify a magnetic resonance signal received by the radio frequency surface coil 319 or the volume coil; the phase detector is used to perform phase detection on the amplified magnetic resonance signal; and the analog-to-digital converter is used to convert the magnetic resonance signal whose phase has been detected from an analog signal to a digital signal. The digitized magnetic resonance signal may be processed, such as calculated or reconstructed, by the data processing unit 330, so as to obtain a medical image; for example, a medical image described in embodiments of the present invention whose image quality type needs to be identified.

The data processing unit 330 may comprise a computer and a storage medium. A program of predetermined data processing to be executed by the computer is recorded on the storage medium. The data processing unit 330 may be connected to the controller unit 320 and perform data processing based on a control signal received from the controller unit 320. The data processing unit 330 may also be connected to the data acquisition unit 314 to receive a magnetic resonance signal output by the data acquisition unit 314, so as to perform the aforementioned data processing.

The controller unit 320 may comprise a computer and a storage medium. The storage medium is used to store a program executable by the computer. When the computer executes the program, scan parameters for performing an imaging scan can be set, enabling a plurality of components of the scanner 310 to perform an operation corresponding to the aforementioned imaging scan sequence. The controller unit 320 may also control the scanner 310 to perform at least one scan from the group consisting of a pre-scan, a whole-body rough scan, and a calibration scan, so as to determine scan parameters for performing the imaging scan based on the obtained information of the implant device.

The controller unit 320 may further obtain information of the implant device via an input device or by accessing to a tested object information memory, wherein the tested object information memory may be disposed in the storage medium of the controller unit 320 or stored in a cloud storage form.

The storage media of the controller unit 320 and the data processing unit 330 may include, for example, a ROM, a floppy disk, a hard disk, an optical disk, a magneto-optical disk, a CD-ROM, or a non-volatile memory card.

The controller unit 320 may be set and/or arranged for use in different manners. For example, in some embodiments, a single controller unit 320 may be used; in other embodiments, a plurality of controller units 320 are configured to work together (for example, based on distributed processing configuration) or separately, wherein each controller unit 320 is configured to process specific aspects and/or functions, and/or to process data for generating a model used only for a specific MRI system 300. In some embodiments, the controller unit 320 may be local (for example, at the same location as one or a plurality of MRI systems 300, such as in the same facility and/or the same local network). In other embodiments, the controller unit 320 may be remote and thus may only be accessed via remote connection (for example, via the Internet or other available remote access technologies). In a specific embodiment, the controller unit 320 may be configured in a cloud storage form, and may be accessed and/or used in a manner substantially similar to a manner of accessing and using other cloud-based systems.

The MRI system 300 further comprises a workbench 340 used for placing the tested object 316 thereon. The tested object 316 may be moved into or out of an imaging space by moving the workbench 340 based on a control signal from the controller unit 320.

The MRI system 300 further comprises an operation console unit 350 connected to the controller unit 320. The operation console unit 350 may transmit an obtained operation signal to the controller unit 320, so as to control the working state of the aforementioned components such as the workbench 340 and the scanner 310. The operation signal may include, for example, a scanning protocol and a parameter selected manually or automatically. The scanning protocol may comprise the aforementioned imaging sequence. In addition, the operation console unit 350 may transmit the obtained operation signal to the controller unit 320 to control the data processing unit 330, so as to obtain a desired image. The operation console unit 350 may comprise user input equipment, such as a keyboard, a mouse, a card reader (an RFID card reader, a bar code reader or the like), a voice activation controller or any other suitable input equipment, which are certain forms of an operator interface. An operator may input an operation signal/control signal to the controller unit 320 via the user input equipment. Further, a user or the controller unit 320 may obtain information (including basic information and/or case information) of a tested object (e.g., a patient) based on the user input equipment (input device).

The MRI system 300 may further comprise a display unit 360, which may be connected to the operation console unit 350 to display an operation interface and may also be connected to the data processing unit 330 to display an image. In addition, the display unit 360 may display a real-time parameter and a corresponding alarm signal.

In some embodiments, the MRI system 300 may be connected, via one or a plurality of configurable wired and/or wireless networks such as the Internet and/or a virtual private network, to one or a plurality of display units, cloud networks, printers, workstations, and/or similar apparatuses located locally or remotely.

Figure 6:
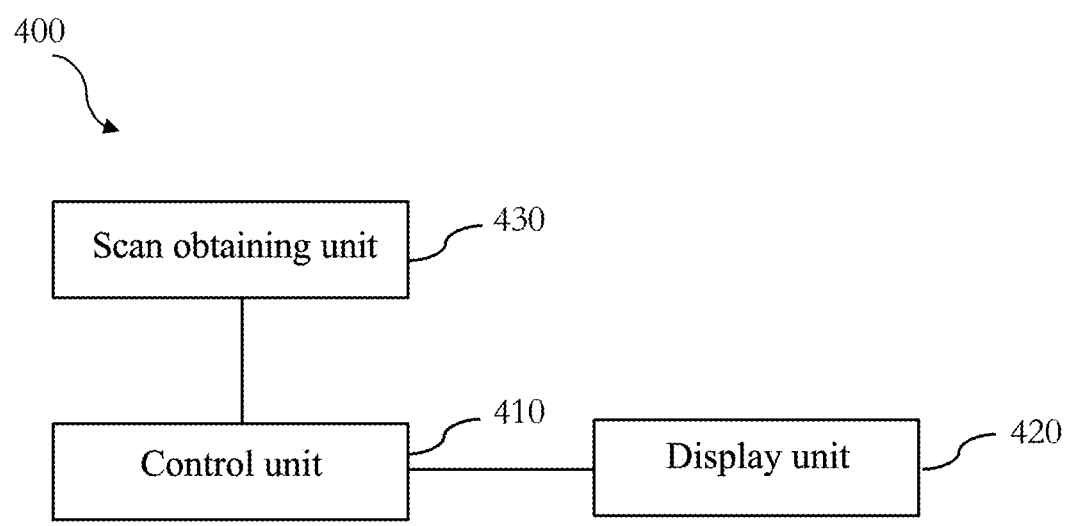
FIG. 6 is a schematic diagram of a magnetic resonance imaging system according to some embodiments of the present invention.

FIG. 6 shows a schematic diagram of a magnetic resonance imaging system 400 according to some embodiments of the present invention. As shown in FIG. 6, the magnetic resonance imaging system 400 comprises a display unit 420.

The display unit 420 is used to indicate in real time values of parameters associated with an implant device in a tested object and safety status of one or a plurality of the parameters during performing the imaging scan. In some embodiments, the display unit 420 is disposed as the display unit 360 in the MRI system 300 shown in FIG. 5 or as a part of the display unit 360 to indicate in real time values of parameters associated with the implant device and safety status of one or a plurality of the parameters.

Specifically, the parameters associated with the implant device include one or more parameters from the group consisting of a gradient magnetic field intensity, a radio frequency magnetic field intensity, a main magnetic field spatial gradient intensity, a temperature, and a specific absorption rate (SAR) (as shown in FIG. 3 and FIG. 4). In some embodiments, the magnetic resonance imaging system further comprises an infrared camera (the component 390 shown in FIG. 5). The infrared camera 390 is installed in a scan cavity of the magnetic resonance imaging system to obtain the temperature of the tested object.

In some embodiments, the display unit 420 is further used to issue a corresponding warning when values of the parameters exceed preset thresholds thereof. The display unit 420 is further used to issue a warning by changing safety status of the parameters when values of the parameters exceed preset thresholds thereof.

As shown in FIG. 6, the magnetic resonance imaging system 400 further comprises a control unit 410. The control unit 410 is used to determine scan parameters for performing an imaging scan based on information of an implant device in a tested object. In some embodiments, the control unit 410 is connected to the controller unit 320 disposed in the MRI system 300 shown in FIG. 5 or is a part of the controller unit 320.

In some embodiments, the magnetic resonance imaging system further comprises an input device (e.g., the operation console unit 350 shown in FIG. 5) and a tested object information memory (e.g., disposed in a storage medium in the controller unit 220 or the data processing unit 230, or configured in a cloud storage form), wherein the control unit 410 is further used to obtain information of an implant device via the input device or by accessing to the tested object information memory. Specifically, basic information of a tested object can be read by a card reader of the input device, such that case information of the tested object is retrieved from the basic information (in the tested object information memory), thereby obtaining information of the implant device. The case information of the tested object can also be directly read by a reader of the input device to obtain information of the implant device. The information of the implant device may also be obtained based on a paper casebook of the tested object, an oral inquiry, or the like, and input to the system through the input device. It will be appreciated by those skilled in the art that the method for obtaining the information of the implant device is not limited to the above-mentioned methods and varies with hospitals, and the information of the implant device may be obtained in an appropriate manner based on different methods (for example, case storage method, etc.) of hospitals.

Specifically, the control unit 410 is further used to obtain rated scan parameters corresponding to the implant device based on the information of the implant device. In some embodiments, the magnetic resonance imaging system has a database storing the information of the implant device and the corresponding rated scan parameters. The rated scan parameters can be obtained based on the database. The database may be disposed in a storage medium in the controller unit 220 or the data processing unit 230 shown in FIG. 5, or disposed in a storage medium configured in the control unit 410, or separately configured in a cloud storage form. The database comprises different models or different manufacturers, or rated scan parameters corresponding to implant devices of other parameters. The rated scan parameters may be available from official websites of the implant devices of different models or manufacturers. In other embodiments, a user may also manually obtain the rated scan parameters from the official website of an implant device based on information of the implant device, such as model or manufacturer.

Further, the magnetic resonance imaging system 400 further comprises a scan obtaining unit 430. The scan obtaining unit 430 is used to obtain location information of the implant device relative to a scan center of the magnetic resonance imaging system based on at least one scan from the group consisting of a pre-scan, a whole-body rough scan, and a calibration scan. The control unit 410 is further used to determine relatively safe scan parameters smaller than scan parameters adopted when no implant is present, based on the location information, obtained by the scan obtaining unit 430, of the implant device relative to the scan center of the magnetic resonance imaging system, so as to obtain scan parameters for performing the imaging scan. In some embodiments, the scan obtaining unit 430 is not disposed separately, but disposed as a part of the control unit 410, i.e., the control unit 410 may set different scanning sequences to perform a pre-scan, a whole-body rough scan, and/or a calibration scan, so as to obtain the relative position of an implant device and determine relatively safe scan parameters based on the position.

In some embodiments, the control unit 410 calculates a difference image based on an image obtained via the scan obtaining unit 430 by changing an imaging parameter (e.g., time of echo (TE)), so as to determine whether an implant device exists in a tested object or not.

The present invention may further provide a non-transitory computer-readable storage medium, for storing an instruction set and/or a computer program. When executed by a computer, the instruction set and/or computer program causes the computer to perform the aforementioned method for obtaining a predicted image of a truncated portion. The computer executing the instruction set and/or computer program may be a computer of an MRI system, or may be other devices/modules of the MRI system. In one embodiment, the instruction set and/or computer program may be programmed into a processor/controller of the computer.

Specifically, when executed by the computer, the instruction set and/or computer program causes the computer to:

indicate in real time values of parameters associated with an implant device in a tested object and safety status of one or a plurality of the parameters during performing an imaging scan.

The instructions described above may be combined into one instruction for execution, and any of the instructions may also be split into a plurality of instructions for execution. Moreover, the present invention is not limited to the instruction execution order described above.

In some embodiments, the instruction set and/or computer program further comprises:

determining scan parameters for performing the imaging scan based on information of an implant device in a tested object, wherein parameters associated with the implant device include one or a plurality of the scan parameters.

In some embodiments, determining scan parameters for performing an imaging scan based on information of an implant device in a tested object comprises:

obtaining rated scan parameters corresponding to the implant device based on the information of the implant device so as to obtain the scan parameters for performing the imaging scan.

In some embodiments, determining scan parameters for performing an imaging scan based on information of an implant device in a tested object comprises:

obtaining the information of the implant device based on at least one scan from the group consisting of a pre-scan, a whole-body rough scan, and a calibration scan, wherein the information of the implant device comprises location information of the implant device relative to a scan center of the magnetic resonance imaging system; and determining relatively safe scan parameters smaller than scan parameters adopted when no implant is present based on the location information of the implant device relative to the scan center of the magnetic resonance imaging system, so as to obtain the scan parameters for performing an imaging scan.

In some embodiments, the instruction set and/or computer program further comprises:

adjusting corresponding scan parameters based on parameters associated with the implant device and performing a new imaging scan.

As used herein, the term "computer" may include any processor-based or microprocessor-based system including a system that uses a microcontroller, a reduced instruction set computer (RISC), an application specific integrated circuit (ASIC), a logic circuit, and any other circuit or processor capable of executing the functions described herein. The above examples are merely exemplary and thus are not intended to limit the definition and/or meaning of the term "computer" in any way.

The instruction set may include various commands that instruct a computer acting as a processor or instruct a processor to perform particular operations, such as the methods and processes of various embodiments. The instruction set may be in the form of a software program, and the software program can form part of one or a plurality of tangible, non-transitory computer-readable media. The software may be in various forms such as system software or application software. In addition, the software may be in the form of a set of independent programs or modules, a program module within a larger program, or part of a program module. The software may also include modular programming in the form of object-oriented programming. The input data may be processed by the processor in response to an operator command, or in response to a previous processing result, or in response to a request made by another processor.

Some exemplary embodiments have been described above; however, it should be understood that various modifications may be made. For example, if the described techniques are performed in a different order and/or if the components of the described system, architecture, device, or circuit are combined in other manners and/or replaced or supplemented with additional components or equivalents thereof, a suitable result can be achieved. Accordingly, other implementation manners also fall within the protection scope of the claims.

The invention claimed is:

1. A magnetic resonance imaging scan method, comprising:

indicating in real time values of parameters associated with an implant device in a tested object and safety status of one or a plurality of the parameters during performing an imaging scan;

wherein, prior to performing the imaging scan, the method further comprises determining scan parameters for performing the imaging scan based on information of the implant device in the tested object, the parameters associated with the implant device including one or a plurality of the scan parameters;

wherein the information of the implant device is obtained based on at least one scan from the group consisting of a pre-scan, a whole-body rough scan, and a calibration scan, and comprises location information of the implant device relative to a scan center of a magnetic resonance imaging system; and wherein determining scan parameters for performing the imaging scan based on the information of the implant device in the tested object comprises:

determining relatively safe scan parameters smaller than scan parameters adopted when no implant is present based on the location information of the implant device relative to the scan center of the magnetic resonance imaging system, so as to obtain the scan parameters for performing the imaging scan.

2. The method of claim 1, wherein the information of the implant device is obtained by receiving information input by a user via an input device of a magnetic resonance imaging system, or by accessing to a tested object information memory.

3. The method of claim 1, wherein the determining scan parameters for performing the imaging scan based on the information of the implant device in the tested object comprises:

obtaining rated scan parameters corresponding to the implant device based on the information of the implant device so as to obtain the scan parameters for performing the imaging scan.

4. The method of claim 3, wherein the rated scan parameters are obtained by accessing to a database storing the information of the implant device and the corresponding rated scan parameters.

5. The method of claim 1, wherein the parameters associated with the implant device are displayed in a display unit of a magnetic resonance imaging system.

6. The method of claim 1, wherein the parameters associated with the implant device include one or more parameters from the group consisting of a gradient magnetic field intensity, a radio frequency magnetic field intensity, a main magnetic field spatial gradient intensity, a temperature, and a specific absorption rate (SAR).

7. The method of claim 6, wherein the temperature is obtained based on magnetic resonance thermometry.

8. The method of claim 1, wherein, when the values of the parameters exceed preset thresholds thereof, a corresponding warning is issued.

9. The method of claim 8, wherein, when the values of the parameters exceed preset thresholds thereof, a warning is issued by changing the safety status of the parameters.

10. The method of claim 1, wherein the method further comprises:
adjusting corresponding scan parameters based on the safety status of the parameters associated with the implant device and performing a new imaging scan based on the adjusted scan parameters.

11. A magnetic resonance imaging scan method, comprising:
performing at least one scan from the group consisting of a pre-scan, a whole-body rough scan, and a calibration scan on a tested object to obtain a corresponding image;
obtaining information of an implant device in the tested object based on the image;
setting scan parameters of an imaging scan, the scan parameters being predetermined based on the information of the implant device, wherein the information comprises location information of the implant device relative to a scan center of a magnetic resonance imaging system;
performing the imaging scan, and indicating in real time values of parameters associated with the implant device of the tested object and safety status of one or a plurality of the parameters, wherein the parameters associated with the implant device include one or a plurality of the scan parameters; and
wherein predetermining scan parameters for performing the imaging scan based on the information of the implant device comprises:
determining relatively safe scan parameters smaller than scan parameters adopted when no implant is present based on the location information of the implant device relative to the scan center of the magnetic resonance imaging system, so as to obtain the scan parameters for performing the imaging scan.

12. A non-transitory computer-readable storage medium for storing computer programs, wherein when executed by a computer, the computer programs cause the computer to perform the magnetic resonance imaging scan method of claim 1.

13. A magnetic resonance imaging system, comprising:
a display unit for indicating in real time values of parameters associated with an implant device in a tested object and safety status of one or a plurality of the parameters during performing an imaging scan;
a control unit for determining scan parameters for performing the imaging scan based on information of the implant device in the tested object, wherein the parameters associated with the implant device include one or a plurality of the scan parameters;
a scan obtaining unit for obtaining location information of the implant device relative to a scan center of the magnetic resonance imaging system based on at least one scan from the group consisting of a pre-scan, a whole-body rough scan, and a calibration scan; and
wherein the control unit is further used to determine relatively safe scan parameters smaller than scan parameters adopted when no implant is present based on the location information of the implant device relative to the scan center of the magnetic resonance imaging system obtained by the scan obtaining unit, so as to obtain the scan parameters for performing the imaging scan.

14. The system of claim 13, wherein the magnetic resonance imaging system further comprises an input device and a tested object information memory, wherein the control unit is further used to receive information input by a user via the input device or to access to the tested object information memory to obtain the information of the implant device.

15. The system of claim 13, wherein the control unit is further used to obtain rated scan parameters corresponding to the implant device based on the information of the implant device, so as to obtain the scan parameters for performing the imaging scan.

16. The system of claim 13, wherein the parameters associated with the implant device include one or more parameters from the group consisting of a gradient magnetic field intensity, a radio frequency magnetic field intensity, a main magnetic field spatial gradient intensity, a temperature, and a specific absorption rate (SAR).

17. The system of claim 16, wherein the system further comprises an infrared camera installed in a scan cavity of the magnetic resonance imaging system to obtain a temperature of the tested object.

18. The system of claim 13, wherein the display unit is further used to issue a corresponding warning when the values of the parameters exceed preset thresholds thereof.

19. The system of claim 18, wherein the display unit is further used to issue a warning by changing the safety status of the parameters when the values of the parameters exceed preset thresholds thereof.

* * * * *